(12) United States Patent
Lee

(10) Patent No.: US 9,990,980 B2
(45) Date of Patent: Jun. 5, 2018

(54) INTERNAL STROBE SIGNAL GENERATING CIRCUIT CAPABLE OF SELECTING DATA RATE AND SEMICONDUCTOR APPARATUS INCLUDING THE SAME

(71) Applicant: SK hynix Inc., Icheon-si Gyeonggi-do (KR)

(72) Inventor: Kwang Hun Lee, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days. days.

(21) Appl. No.: 15/018,169

(22) Filed: Feb. 8, 2016

(65) Prior Publication Data

US 2017/0117031 A1      Apr. 27, 2017

(30) Foreign Application Priority Data

Oct. 22, 2015   (KR) .......................... 10-2015-0147408

(51) Int. Cl.
*G11C 7/00* (2006.01)
*G11C 11/4076* (2006.01)
*G11C 7/10* (2006.01)
*G11C 7/22* (2006.01)

(52) U.S. Cl.
CPC ........ *G11C 11/4076* (2013.01); *G11C 7/1012* (2013.01); *G11C 7/1084* (2013.01); *G11C 7/1093* (2013.01); *G11C 7/222* (2013.01)

(58) Field of Classification Search
CPC ... G11C 11/4076; G11C 7/222; G11C 7/1093; G11C 7/1012; G11C 7/1084
USPC ........................................................ 365/193
See application file for complete search history.

(56) References Cited

U.S. PATENT DOCUMENTS

| | | | |
|---|---|---|---|
| 7,032,092 B2 | 4/2006 | Lai | |
| 2003/0031082 A1* | 2/2003 | Sawada | G11C 7/1066 365/233.1 |
| 2006/0203575 A1* | 9/2006 | Han | G11C 7/1078 365/194 |
| 2012/0195141 A1 | 8/2012 | Magee et al. | |
| 2014/0111256 A1* | 4/2014 | Song | H03M 9/00 327/115 |

\* cited by examiner

*Primary Examiner* — Tha-O H Bui
(74) *Attorney, Agent, or Firm* — William Park & Associates Ltd.

(57) ABSTRACT

An internal strobe signal generating circuit may include a data rate selection circuit, a division circuit and a strobe output circuit. The data rate selection circuit may enable a data rate selection signal according to operational information. The division circuit may generate a divided strobe signal by dividing a data strobe signal in response to the data rate selection signal. The strobe output circuit may generate, in response to the data rate selection signal, an internal strobe signal based on one of the divided strobe signal and the data strobe signal.

9 Claims, 7 Drawing Sheets

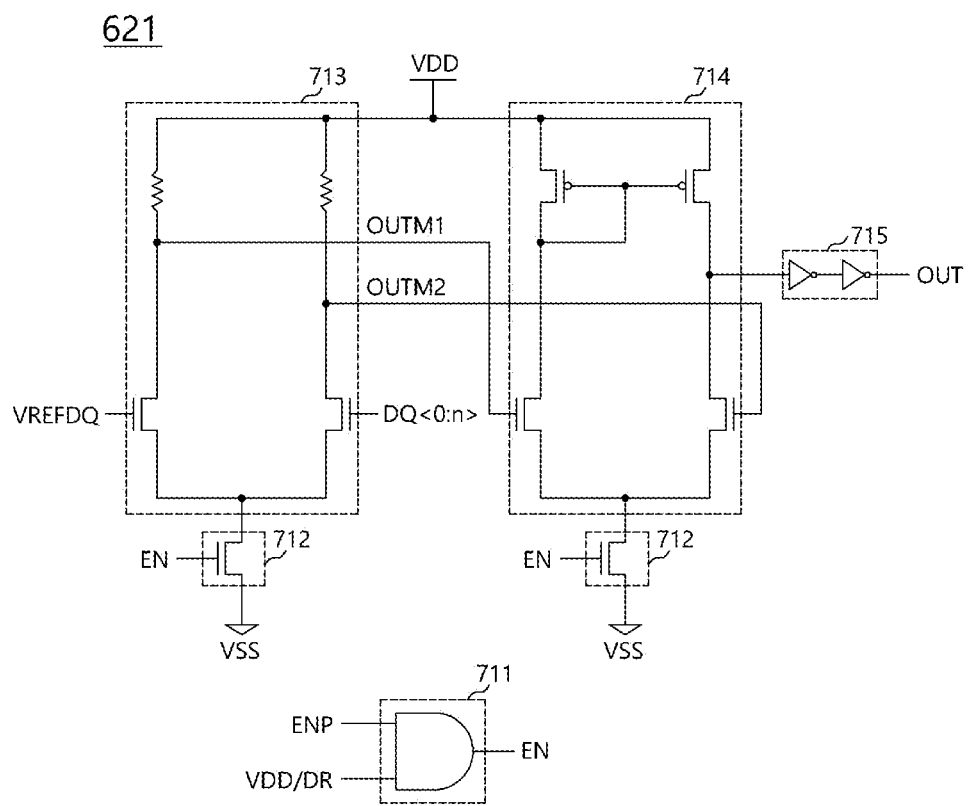

INTERNAL STROBE SIGNAL GENERATING CIRCUIT CAPABLE OF SELECTING DATA RATE AND SEMICONDUCTOR APPARATUS INCLUDING THE SAME

CROSS-REFERENCES TO RELATED APPLICATION

The present application claims priority under 35 U.S.C. § 119(a) to Korean application number 10-2015-0147408 filed on Oct. 22, 2015, in the Korean Intellectual Property Office, which is incorporated herein by reference in its entirety.

BACKGROUND

1. Technical Field

Various embodiments generally relate to a semiconductor apparatus, and more particularly to an internal strobe signal generating circuit capable of selecting data rate and semiconductor apparatus including the same.

2. Related Art

A semiconductor apparatus such as a processor and semiconductor memories (e.g., DRAM) may receive and output data in synchronization with a clock signal. The single data rate (SDR) scheme allows the semiconductor apparatus to receive data in synchronization with a rising edge of the clock signal. As the operation speed of the semiconductor apparatus becomes faster, the double data rate (DDR) scheme has been proposed to allow the semiconductor apparatus to receive data in synchronization with both the rising and falling edges of the clock signal.

The semiconductor apparatus uses a data strobe signal as the clock signal for receiving the data. The data strobe signal may have the same period as a clock signal. As the operation speed of the semiconductor apparatus becomes faster, the frequency of a system clock signal used for the communication between a host and a memory apparatus increases. As a result, the pulse width of the data strobe signal for receiving the data becomes narrower, and thus the timing margin for receiving the data becomes smaller.

SUMMARY

In an embodiment of the present invention, an internal strobe signal generating circuit may include a data rate selection circuit, a division circuit, and a strobe output circuit. The data rate selection circuit may enable a data rate selection signal according to operational information. The division circuit may generate a divided strobe signal by dividing a data strobe signal in response to the data rate selection signal. The strobe output circuit may generate, in response to the data rate selection signal, an internal strobe signal based on one of the divided strobe signal and the data strobe signal.

In an embodiment of the present invention, a semiconductor apparatus may include an internal strobe signal and a data arrangement circuit. The internal strobe signal generating circuit may receive a data strobe signal and a complementary data strobe signal, and to generate a plurality of internal strobe signals, a number of which and a period of which vary according to an operational information. The data arrangement circuit may receive a plurality of data signals, and to align the plurality of data signals to the plurality of internal strobe signals.

In an embodiment of the present invention, a semiconductor apparatus may include a data rate selection circuit, a division circuit, and a strobe output circuit. The data rate selection circuit may generate a data rate selection signal, a logic level of the data rate selection signal varying depending on a frequency of a clock signal. The division circuit may generate one or more frequency-divided data strobe signals by using a data strobe signal. The strobe output circuit may, in response to the data rate selection signal, generate an internal strobe signal based on one of the data strobe signal and the frequency-divided strobe signals.

BRIEF DESCRIPTION OF THE DRAWINGS

FIG. 7 is a diagram illustrating an example of a differential amplification section illustrated in FIG. 6B.

DETAILED DESCRIPTION

Hereinafter, a semiconductor apparatus according to an embodiment of the present invention will be described below with reference to the accompanying drawings.

Figure 1:
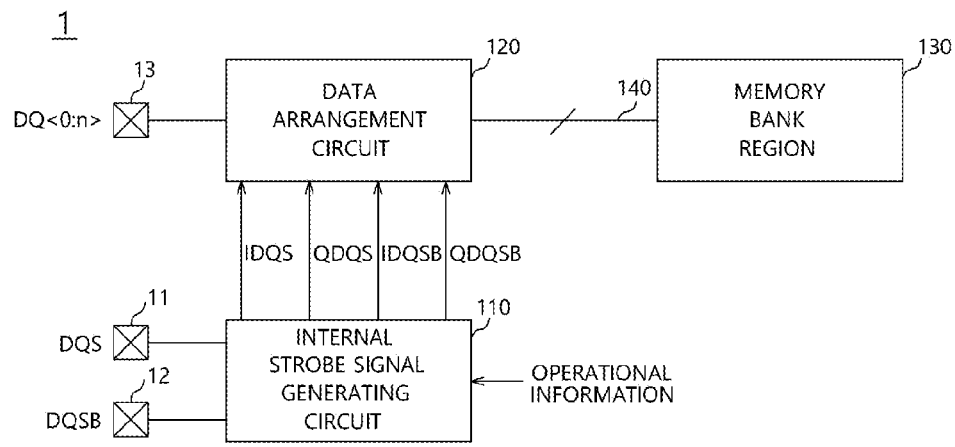
FIG. 1 is a diagram illustrating an example of a semiconductor apparatus in accordance with an embodiment of the present disclosure.

FIG. 1 is a diagram illustrating an example of a semiconductor apparatus 1 in accordance with an embodiment of the present disclosure. Referring to FIG. 1, the semiconductor apparatus 1 may include an internal strobe signal generating circuit 110 and a data arrangement circuit 120. The internal strobe signal generating circuit 110 may receive a data strobe signal DQS from an external device. The semiconductor apparatus 1 may include a plurality of pads 11, 12, and 13. The semiconductor apparatus 1 may receive a pair of data strobe signals DQS and DQSB through data strobe pads 11 and 12. Also, the semiconductor apparatus 1 may receive data DQ<0:n> through a data pad 13. The internal strobe signal generating circuit 110 may receive the data strobe signal DQS and the complementary data strobe signal DQSB through the data strobe pads 11 and 12. The internal strobe signal generating circuit 110 may receive operational information. The internal strobe signal generating circuit 110 may generate a plurality of internal strobe signals IDQS, QDQS, IDQSB, and QDQSB based on the data strobe signal DQS and the complementary data strobe signal DQSB according to the operational information. The operational information may include information about the operation speed of the semiconductor apparatus 1, which will be described later.

The internal strobe signal generating circuit 110 may generate the plurality of internal strobe signals IDQS, QDQS, IDQSB, and QDQSB. Although FIG. 1 illustrates four internal strobe signals IDQS, QDQS, IDQSB, and QDQSB, the number of the internal strobe signals is not limited thereto. In addition, the periods of internal strobe signals IDQS, QDQS, IDQSB, and QDQSB do not have to be the same as one another. For example, the internal strobe signal generating circuit 110 may generate four internal strobe signals having a first period when the semiconductor apparatus 1 operates at high frequency and/or high speed, and may generate two internal strobe signals having a second period when the semiconductor apparatus 1 operates at low frequency and/or low speed, which are lower than the frequency and speed at which the semiconductor apparatus 1 operates when the internal strobe signal generating circuit 110 generates the internal strobe signals having the first period. The second period may be shorter than the first period. For example, the second period may have a period half the first period. When the semiconductor apparatus 1 operates at the high frequency and/or the high speed, the internal strobe signal generating circuit 110 may divide the data strobe signal DQS and the complementary data strobe signal DQSB, and may generate the plurality of internal strobe signals IDQS, QDQS, IDQSB, and QDQSB based on the divided data strobe signal DQS and the divided complementary data strobe signal DQSB. Therefore, the plurality of internal strobe signals IDQS, QDQS, IDQSB, and QDQSB may have a greater period than the data strobe signal DQS. When the semiconductor apparatus 1 operates at the low frequency and/or the low speed, the internal strobe signal generating circuit 110 may generate a part of the plurality of internal strobe signals IDQS, QDQS, IDQSB, and QDQSB from the data strobe signal DQS and the complementary data strobe signal DQSB without dividing the data strobe signal DQS and the complementary data strobe signal DQSB. The number of the plurality of the internal strobe signals generated when the semiconductor apparatus 1 operates at the high frequency and/or the high speed may be greater than the number of the plurality of the internal strobe signals generated when the semiconductor apparatus 1 operates at the low frequency and/or the low speed. Also, the period of plurality of internal strobe signals generated when the semiconductor apparatus 1 operates at the high frequency and/or the high speed may be greater than the period of plurality of internal strobe signals generated when the semiconductor apparatus 1 operates at the low frequency and/or the low speed.

The data arrangement circuit 120 may receive the data DQ<0:n>, and may store the data DQ<0:n> in synchronized with the plurality of internal strobe signals IDQS, QDQS, IDQSB, and QDQSB. The semiconductor apparatus 1 may perform a serial data communication with an external device. Therefore, a plurality of data DQ<0:n> may be consecutively inputted through the data pad 13. The data arrangement circuit 120 may arrange the plurality of data DQ<0:n> and output the arranged data DQ<0:n> in synchronized with the plurality of internal strobe signals IDQS, QDQS, IDQSB, and QDQSB.

The semiconductor apparatus 1 may be a host. Alternatively, the semiconductor apparatus 1 may be a memory. The host may include one or more of the central processing unit (CPU), the graphic processing unit (GPU), the multi-media processor (MMP) and the digital signal processor. The host may be implemented in a form of the system on chip (SoC) by combining processor chips having various functions such as the application processor (AP). The memory may include therein one or more of a volatile memory device and a non-volatile memory. The volatile memory may include the static RAM (SRAM), the dynamic RAM (DARM), and the synchronous DRAM (SDRAM). The non-volatile memory may include the read only memory (ROM), the programmable ROM (PROM), the electrically erase and programmable ROM (EEPROM), the electrically programmable ROM (EPROM), the flash memory, the phase change RAM (PRAM), the magnetic RAM (MRAM), the resistive RAM (RRAM), and the ferroelectric RAM (FRAM). If the semiconductor apparatus 1 is the memory, the memory 1 may further include a memory bank region 130. The memory bank region 130 may include a memory cell array that stores data, and input/output circuits that stores data output from the data arrangement circuit 120 and outputs data stored in the memory cell array. The data arrangement circuit 120 and the memory bank region 130 may be coupled to each other through data transmission lines 140. A number of the data transmission lines 140 may be enough to simultaneously transmit parallel data arranged by the data arrangement circuit 120.

Figure 2:
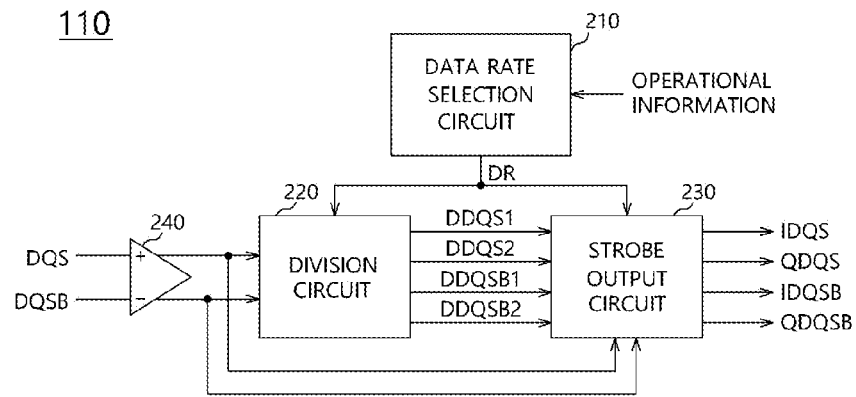
FIG. 2 is a diagram illustrating an example of an internal strobe signal generating circuit illustrated in FIG. 1.

FIG. 2 is a diagram illustrating an example of the internal strobe signal generating circuit 110 illustrated in FIG. 1. Referring to FIG. 2, the internal strobe signal generating circuit 110 may include a data rate selection circuit 210, a division circuit 220 and a strobe output circuit 230. The data rate selection circuit 210 may generate a data rate selection signal DR based on the operational information. As described above, the operational information may include the information about the operation speed of the semiconductor apparatus 1. The data rate selection circuit 210 may enable the data rate selection signal DR when the semiconductor apparatus 1 operates at high frequency and/or high speed, and may disable the data rate selection signal DR when the semiconductor apparatus 1 operates at the low frequency and/or the low speed.

The division circuit 220 may receive the data strobe signal DQS, the complementary data strobe signal DQSB, and the data rate selection signal DR. The division circuit 220 may not divide the data strobe signal DQS and the complementary data strobe signal DQSB in response to the data rate selection signal DR disabled. The division circuit 220 may generate a plurality of divided strobe signals by dividing the data strobe signal DQS and the complementary data strobe signal DQSB in response to the data rate selection signal DR enabled. As illustrated in FIG. 2, the division circuit 220 may generate first to fourth divided strobe signals DDQS1, DDQS2, DDQSB1, and DDQSB2 by dividing the data strobe signal DQS and the complementary data strobe signal DQSB. The first divided strobe signal DDQS1 may be a signal that is obtained by dividing the frequency of the data strobe signal DQS by two, and the second divided strobe signal DDQS2 may be a signal that is obtained by dividing the frequency of the complementary data strobe signal DQSB by two. The third divided strobe signal DDQSB1 may be an inverted first divided strobe signal DDQS1, and the fourth divided strobe signal DDQSB2 may be an inverted second divided strobe signal DDQS2.

The strobe output circuit 230 may receive the data strobe signal DQS, the complementary data strobe signal DQSB, the first to fourth divided strobe signals DDQS1, DDQS2, DDQSB1, and DDQSB2, and the data rate selection signal DR. The strobe output circuit 230 may generate the plurality of internal strobe signals IDQS, QDQS, IDQSB, and QDQSB according to the data rate selection signal DR. As illustrated in FIG. 2, the strobe output circuit 230 may generate the first to fourth internal strobe signals IDQS, QDQS, IDQSB, and QDQSB. The strobe output circuit 230 may output the first to fourth divided strobe signals DDQS1, DDQS2, DDQSB1, and DDQSB2 as the first to fourth internal strobe signals IDQS, QDQS, IDQSB, and QDQSB, respectively, in response to the data rate selection signal DR enabled. The strobe output circuit 230 may output the data strobe signal DQS and the complementary data strobe signal DQSB as the first and third internal strobe signals IDQS and IDQSB, respectively, in response to the data rate selection signal DR disabled. In an embodiment, the strobe output circuit 230 may not generate the second and fourth internal strobe signals QDQS and QDQSB by disabling the second and fourth internal strobe signals QDQS and QDQSB.

The internal strobe signal generating circuit 110 may further include a strobe buffer 240. The strobe buffer 240 may buffer and output the data strobe signal DQS and the complementary data strobe signal DQSB. The strobe buffer 240 may delay the data strobe signal DQS and the complementary data strobe signal DQSB in order to center align the data strobe signal DQS and the complementary data strobe signal DQSB with the data DQ<0:n>. For example, the data strobe signal DQS and the complementary data strobe signal DQSB may be delayed by the amount of time corresponding to half a window or a duration of the data DQ<0:n> and/or a quarter of a period of a clock signal.

Figure 3A:
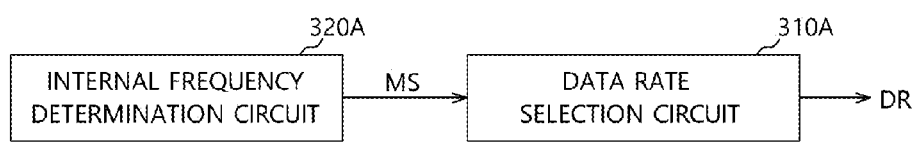
FIGS. 3A to 3C are diagrams illustrating configuration examples that generate operational information and illustrating examples of a data rate selection circuit in accordance with an embodiment of the present disclosure.
Figure 3B:
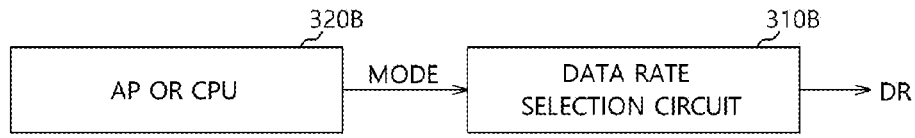
Figure 3C:
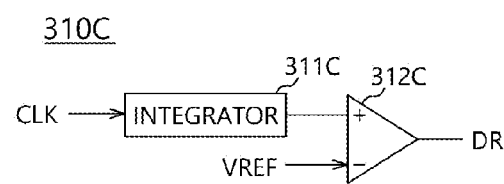

FIGS. 3A to 3C are diagrams illustrating configuration examples that generate the operational information and the data rate selection circuit 310A, 310B, and 310C in accordance with an embodiment of the present disclosure. Referring to FIG. 3A, the data rate selection circuit 310A may receive a mode register signal MS from an internal frequency determination circuit 320A. The mode register signal MS may include information about an operating frequency and/or speed of the semiconductor apparatus 1. When the semiconductor apparatus 1 is the memory, the internal frequency determination circuit 320A may be the mode register set and the information related to the operating speed set in the mode register set may be provided to the data rate selection circuit 310A as the mode register signal MS. The data rate selection circuit 310A may enable or disable the data rate selection signal DR in response to the mode register signal MS.

Referring to FIG. 3B, the data rate selection circuit 310B may receive a mode signal MODE from the host such as the application processor (AP), the central processing circuit (CPU), and so forth. The mode signal MODE may include information about an operation mode of the semiconductor apparatus 1 as well as information about the operating frequency and/or speed of the semiconductor apparatus 1. For example, the mode signal MODE may include information about the operation mode such as playing MP3 files and video files, execution of game programs, and so forth. The data rate selection circuit 310B may enable or disable the data rate selection signal DR in response to the mode signal MODE.

Referring to FIG. 3C, the data rate selection circuit 310C may include an integrator 311C and a comparator 312C. The integrator 311C may receive a clock signal CLK and generate a voltage having different levels according to the clock signal CLK. For example, as a frequency of the clock signal CLK becomes large, the voltage level the integrator 311C generates may increase, and as the frequency of the clock signal CLK becomes small. The comparator 312C may generate the data rate selection signal DR by comparing a reference voltage VREF and an output of the integrator 311C. The comparator 312C may enable the data rate selection signal DR when the output of the integrator 311C has a higher level than the reference voltage VREF, and disable the data rate selection signal DR when the output of the integrator 311C has a lower level than the reference voltage VREF. The level of the reference voltage VREF may be arbitrarily set in order to determine whether the clock signal CLK has a greater or smaller frequency. FIGS. 3A to 3C illustrate examples of the data rate selection circuit 310A, 310B, and 310C. Any element configured to generate the data rate selection signal DR by adequately determining the operation speed of the semiconductor apparatus 1 in order to conform to the purpose of the present disclosure will fall in the scope of the present disclosure.

Figure 4:
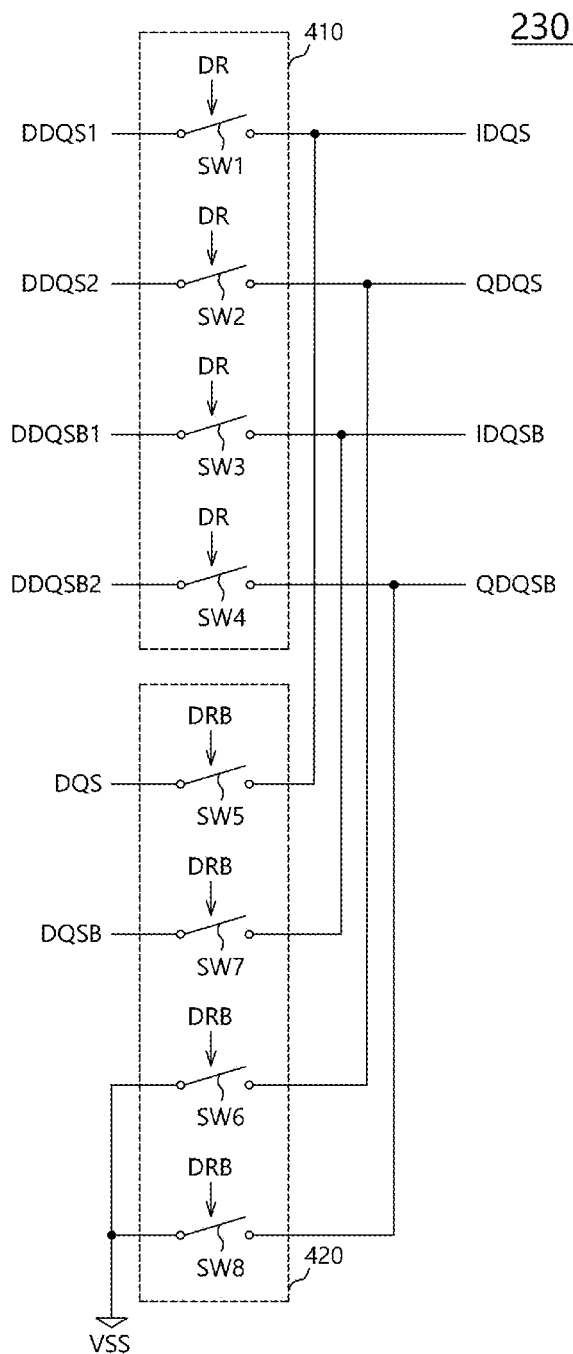
FIG. 4 is a diagram illustrating an example of a strobe output circuit illustrated in FIG. 2.

FIG. 4 is a diagram illustrating an example of the strobe output circuit 230 illustrated in FIG. 2. The strobe output circuit 230 may include a first output section 410 and a second output section 420. The first output section 410 may output the first to fourth divided strobe signals DDQS1, DDQS2, DDQSB1, and DDQSB2 as the first to fourth internal strobe signals IDQS, QDQS, IDQSB, and QDQSB, respectively. The first output section 410 may include first to fourth switches SW1, SW2, SW3, and SW4. The first to fourth switches SW1, SW2, SW3, and SW4 may be turned on in response to the data rate selection signal DR enabled. The first switch SW1 may output the first divided strobe signal DDQS1 as the first internal strobe signal IDQS, the second switch SW2 may output the second divided strobe signal DDQS2 as the second internal strobe signal QDQS, the third switch SW3 may output the third divided strobe signal DDQSB1 as the third internal strobe signal IDQSB, and the fourth switch SW4 may output the fourth divided strobe signal DDQSB2 as the fourth internal strobe signal QDQSB.

The second output section 420 may output the data strobe signal DQS and the complementary data strobe signal DQSB as the first and third internal strobe signals IDQS and IDQSB, respectively. The second output section 420 may include fifth to eighth switches SW5, SW6, SW7, and SW8. The fifth to eighth switches SW5, SW6, SW7, and SW8 may be turned on in response to the data rate selection signal DR disabled. The fifth to eighth switches SW5, SW6, SW7, and SW8 may be turned on in response to an inverted data rate selection signal DRB enabled. The fifth switch SW5 may output the data strobe signal DQS as the first internal strobe signal IDQS, and the seventh switch SW7 may output the complementary data strobe signal DQSB as the third internal strobe signal IDQSB. The second switch SW6 and the eighth switch SW8 may provide a ground voltage as the second and fourth internal strobe signals QDQS and QDQSB. Therefore, the second output section 420 may disable the second and fourth internal strobe signals QDQS and QDQSB.

Figure 5:
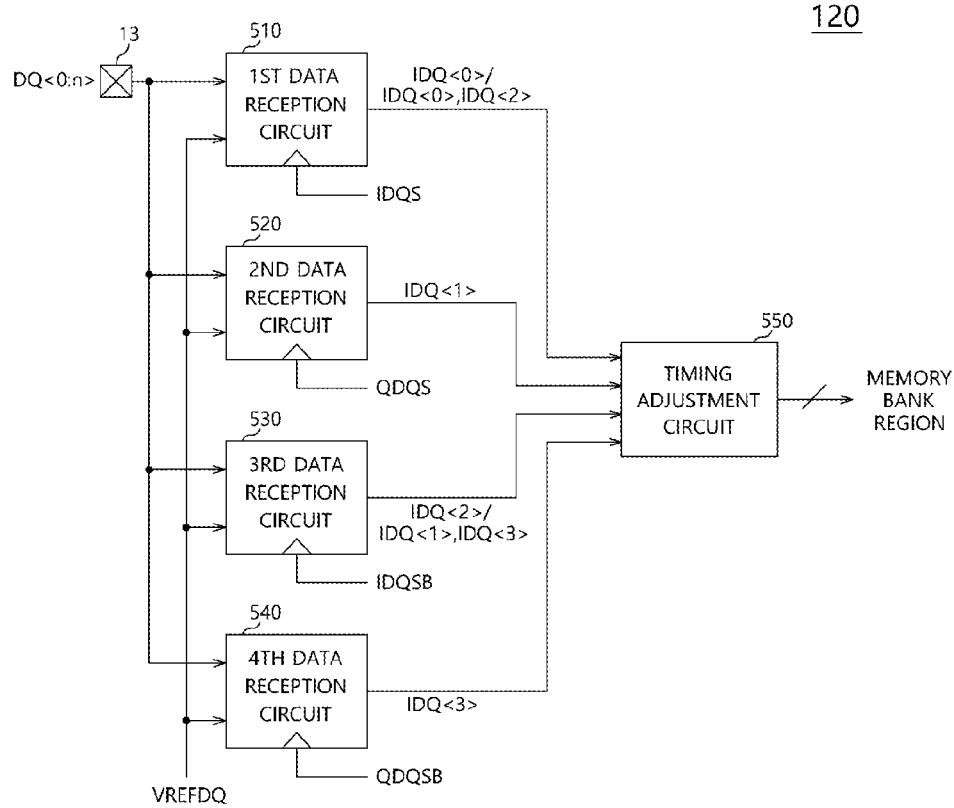
FIG. 5 is a diagram illustrating an example of a data arrangement circuit illustrated in FIG. 1.

FIG. 5 is a diagram illustrating an example of the data arrangement circuit 120 illustrated in FIG. 1. Referring to FIG. 5, the data arrangement circuit 120 may include a first data reception circuit 510, a second data reception circuit 520, a third data reception circuit 530, and a fourth data reception circuit 540. The first data reception circuit 510 may receive the data DQ<0:n> input through the data pad 13 in response to a data reference voltage VREFDQ and the first internal strobe signal IDQS. The first data reception circuit 510 may generate a first internal data IDQ<0> by comparing the data DQ<0:n> and the data reference voltage VREFDQ when the first internal strobe signal IDQS has a logic high level. The second data reception circuit 520 may receive the data DQ<0:n> in response to the data reference voltage VREFDQ and the second internal strobe signal QDQS. The second data reception circuit 520 may generate a second internal data IDQ<1> by comparing the data DQ<0:n> and the data reference voltage VREFDQ when the second internal strobe signal QDQS has a logic high level. The third data reception circuit 530 may receive the data DQ<0:n> in response to the data reference voltage VREFDQ and the third internal strobe signal IDQSB. The third data reception circuit 530 may generate a third internal data IDQ<2> by comparing the data DQ<0:n> and the data reference voltage VREFDQ when the third internal strobe signal IDQSB has a logic high level. The fourth data reception circuit 540 may receive the data DQ<0:n> in response to the data reference voltage VREFDQ and the fourth internal strobe signal QDQSB. The fourth data reception circuit 540 may generate a fourth internal data IDQ<3> by comparing the data DQ<0:n> and the data reference voltage VREFDQ when the fourth internal strobe signal QDQSB has a logic high level. The level of the data reference voltage VREFDQ may be arbitrarily set in order to determine whether the data DQ<0:n> is at logic low level ("0") or logic high level ("1"). The data reference voltage VREFDQ may be generated by an internal circuit of the semiconductor apparatus 1. Alternatively, the data reference voltage VREFDQ may be provided from an external device. The data arrangement circuit 120 may convert the plurality of data DQ<0:n>, which are serial data consecutively provided through the data pad 13, into the internal data IDQ<0:3>, which are parallel data, and output the internal data IDQ<0:3> through the first to fourth data reception circuits 510, 520, 530 and 540, which operate according to the first to fourth internal strobe signals IDQS, QDQS, IDQSB, and QDQSB.

When the internal strobe signal generating circuit 110 generates all of the first to fourth internal strobe signals IDQS, QDQS, IDQSB, and QDQSB, all of the first to fourth data reception circuits 510, 520, 530 and 540 may operate. The first data reception circuit 510 may receive first one DQ<0> of the plurality of the data DQ<0:n> and generate the first internal data IDQ<0> in synchronization with the first internal strobe signal IDQS. The second data reception circuit 520 may receive second one DQ<1> of the plurality of the data DQ<0:n> and generate the second internal data IDQ<1> in synchronization with the second internal strobe signal QDQS. The third data reception circuit 530 may receive third one DQ<2> of the data DQ<0:n> and generate the third internal data IDQ<2> in synchronization with the third internal strobe signal IDQSB. The fourth data reception circuit 540 may receive fourth one DQ<3> of the data DQ<0:n> and generate the fourth internal data IDQ<3> in synchronization with the fourth internal strobe signal QDQSB.

When the internal strobe signal generating circuit 110 generates the first and third internal strobe signals IDQS and IDQSB, only the first and third data reception circuits 510 and 530 may operate. The first data reception circuit 510 may receive first one DQ<0> of the plurality of the data DQ<0:n> and generate the first internal data IDQ<0> in synchronization with a first rising edge of the first internal strobe signal IDQS. The third data reception circuit 530 may receive second one DQ<1> of the data DQ<0:n> and generate the second internal data IDQ<1> in synchronization with a first rising edge of the third internal strobe signal IDQSB. The first data reception circuit 510 may receive third one DQ<2> of the plurality of the data DQ<0:n> and generate the third internal data IDQ<2> in synchronization with a second rising edge of the first internal strobe signal IDQS. The third data reception circuit 530 may receive fourth one DQ<3> of the data DQ<0:n> and generate the fourth internal data IDQ<3> in synchronization with a second rising edge of the third internal strobe signal IDQSB.

The data arrangement circuit 120 may further include a timing adjustment circuit 550. The timing adjustment circuit 550 may control the internal data IDQ<0:3> provided from the first to fourth data reception circuits 510, 520, 530, and 540, and may output the controlled internal data IDQ<0:3> to the memory bank region 130. When the internal strobe signal generating circuit 110 generates all of the first to fourth internal strobe signals IDQS, QDQS, IDQSB, and QDQSB, and all of the first to fourth data reception circuits 510, 520, 530, and 540 operate, the timing adjustment circuit 550 may output all of the internal data IDQ<0:3>, which are provided from the first to fourth data reception circuits 510, 520, 530, and 540, to the memory bank region 130. When the internal strobe signal generating circuit 110 generates the first and third internal strobe signals IDQS and IDQSB and only the first and third data reception circuits 510 and 530 operate, the timing adjustment circuit 550 may arrange the internal data IDQ<0:3> provided from the first and third data reception circuits 510 and 530 and output the arranged internal data IDQ<0:3> to the memory bank region 130.

Figure 6A:
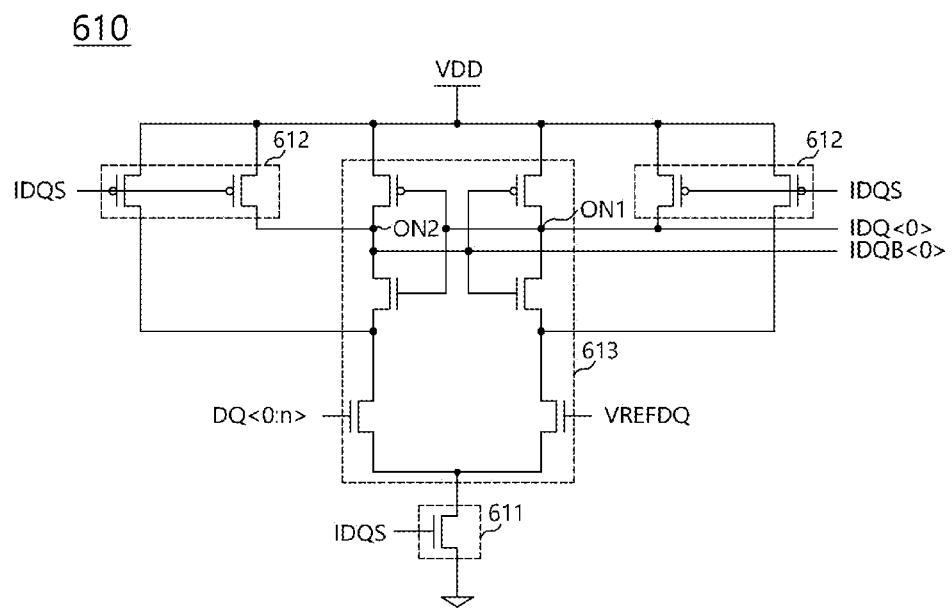
FIGS. 6A and 6B are diagrams illustrating examples of a first data reception circuit illustrated in FIG. 5.

FIG. 6A is a diagram illustrating an example of the first data reception circuit 510 illustrated in FIG. 5. Referring to FIG. 6A, the first data reception circuit 510 may include a latch buffer 610. The latch buffer 610 may include an enablement section 611, a precharge section 612, and a latch amplification section 613. The enablement section 611 may receive the first internal strobe signal IDQS. The enablement section 611 may activate the latch amplification section 613 when the firs internal strobe signal IDQS has a logic high level. The enablement section 611 may form a current path between the latch amplification section 613 and the ground voltage VSS in response to the first internal strobe signal IDQS.

The precharge section 612 may precharge first and second output nodes ON1 and ON2 in response to the first internal strobe signal IDQS. The first internal data IDQ<0> may be output through the first output node ON1, and a complementary first internal data IDQB<0> may be output through the second output node ON2. The precharge section 612 may precharge the first and second output nodes ON1 and ON2 to a power supply voltage level when the first internal strobe signal IDQS has a logic low level, and may release the precharge of the first and second output nodes ON1 and ON2 when the first internal strobe signal IDQS has a logic high level.

The latch amplification section 613 may receive the data DQ<0:n> and the data reference voltage VREFDQ. The latch amplification section 613 may drive the first output node ON1 to a high level and the second output node ON2 to a low level when the data DQ<0:n> have a higher level than the data reference voltage VREFDQ. Therefore, the first internal data IDQ<0> having a logic high level may be output through the first output node ON1. The latch amplification section 613 may drive the first output node ON1 to a low level and the second output node ON2 to a high level when the data DQ<0:n> have a lower level than the data reference voltage VREFDQ. Therefore, the first internal data IDQ<0> having a logic low level may be output through the first output node ON1. The latch amplification section 613 may be activated only when the first internal strobe signal IDQS has a high level to differentially amplify the data DQ<0:n> and the data reference voltage VREFDQ, and to generate the first internal data IDQ<0>. Each of the second to fourth data reception circuits 520, 530, and 540 may have the same configuration as the first data reception circuit 510 except that the signals input to the first to fourth data reception circuits 510, 520, 530 and 540 are different from one another.

Figure 6B:
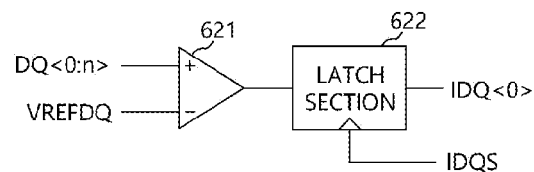

FIG. 6B is a diagram illustrating an example of the first data reception circuit 510 illustrated in FIG. 5. Referring to FIG. 6B, the first data reception circuit 510 may include a differential amplification section 621 and a latch section 622. The example of the first data reception circuit 510 illustrated in FIG. 6B may further include the differential amplification section 621, which can amplify data signals, and the latch section 622, which can store data signals, while the example of the first data reception circuit 510 illustrated in FIG. 6A includes the latch buffer 610 which can carry out both the amplification and storage of data signals. The differential amplification section 621 may differentially amplify the data DQ<0:n> and the data reference voltage VREFDQ. The latch section 622 may generate the first internal data IDQ<0> by latching an output of the differential amplification section 621 in response to the first internal strobe signal IDQS.

FIG. 7 is a diagram illustrating an example of the differential amplification section 621 illustrated in FIG. 6B. Referring to FIG. 7, the differential amplification section 621 may include an enablement control portion 711, an enablement portion 712, a first amplification stage 713, a second amplification stage 714, and a driving stage 715. The enablement control portion 711 may receive a buffer enablement signal ENP and the power supply voltage VDD or the data rate selection signal DR, and may generate an enablement signal EN. The enablement control portion 711 may include an AND gate. More specifically, the enablement control portion 711 of the differential amplification section 621 included in the first and third data reception circuits 510 and 530 may receive the buffer enablement signal ENP and the power supply voltage VDD, and may generate the enablement signal EN. The enablement control portion 711 of the differential amplification section 621 included in the second and fourth data reception circuits 520 and 540 may receive the buffer enablement signal ENP and the data rate selection signal DR, and may generate the enablement signal EN. Therefore, the enablement control portion 711 of the differential amplification section 621 included in the first and third data reception circuits 510 and 530 may provide the buffer enablement signal ENP as the enablement signal EN regardless of the data rate selection signal DR. On the other hand, the enablement control portion 711 of the differential amplification section 621 included in the second and fourth data reception circuits 520 and 540 may provide the buffer enablement signal ENP as the enablement signal EN in response to the data rate selection signal DR enabled. The buffer enablement signal ENP may be generated within the semiconductor apparatus 1 in order to activate the differential amplification section 621.

The enablement portion 712 may activate the first and second amplification stages 713 and 714 when the enablement signal EN is enabled. The enablement portion 712 may form a current path between the first amplification stage 713 and the ground voltage VSS, and a current path between the second amplification stage 714 and the ground voltage VSS. The first amplification stage 713 may differentially amplify the data DQ<0:n> and the data reference voltage VREFDQ, and may generate first and second intermediate output signals OUTM1 and OUTM2. The second amplification stage 714 may differentially amplify the first and second intermediate output signals OUTM1 and OUTM2. The driving stage 715 may buffer an output of the second amplification stage 714 and output an output signal OUT by buffering. The output signal OUT may be provided to the latch section 622.

Figure 8A:
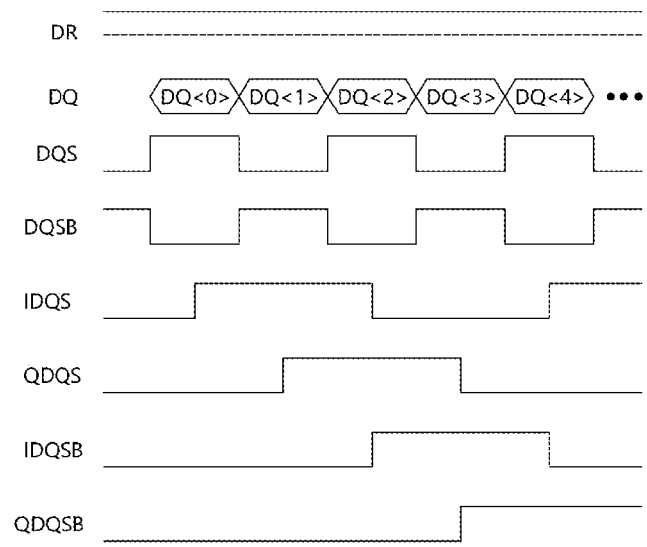
FIGS. 8A and 8B are timing diagrams illustrating example operations of an internal strobe signal generating circuit in accordance with an embodiment of the present disclosure.
Figure 8B:
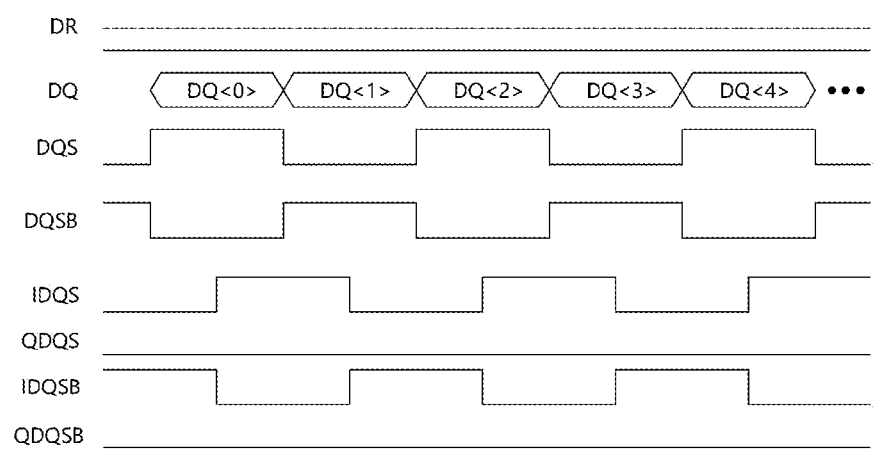

FIGS. 8A and 8B are timing diagrams illustrating example operations of the semiconductor apparatus 1 in accordance with an embodiment of the present disclosure. FIG. 8A illustrates the operation when the semiconductor apparatus 1 operates at high frequency and/or high speed, and FIG. 8B illustrates the operation when the semiconductor apparatus 1 operates at low frequency and/or low speed, which are lower than the frequency and speed of the example illustrated in FIG. 8A. Referring to FIGS. 1 to 8B, the operation of the semiconductor apparatus 1 in accordance with an embodiment of the present disclosure is as follows. As illustrated in FIG. 8A, when the semiconductor apparatus 1 operates at high frequency and/or high speed, the data rate selection circuit 210 may enable the data rate selection signal DR according to the operational information of the semiconductor apparatus 1. The division circuit 220 may generate the first to fourth divided strobe signals DDQS1, DDQS2, DDQSB1, and DDQSB2 by dividing the data strobe signal DQS and the complementary data strobe signal DQSB in response to the enabled data rate selection signal DR. The strobe output circuit 230 may provide the first to fourth divided strobe signals DDQS1, DDQS2, DDQSB1, and DDQSB2 as the first to fourth internal strobe signals IDQS, QDQS, IDQSB and QDQSB in response to the enabled data rate selection signal DR. The internal strobe signal generating circuit 110 may provide all of the first to fourth internal strobe signals IDQS, QDQS, IDQSB and QDQSB, and all of the first to fourth data reception circuits 510, 520, 530 and 540 may be operable. The first data reception circuit 510 may receive the first one DQ<0> of the plurality of the data DQ<0:n> and generate the first internal data IDQ<0> in synchronization with rising edge of the first internal strobe signal IDQS. The second data reception circuit 520 may receive the second one DQ<1> of the plurality of the data DQ<0:n> and generate the second internal data IDQ<1> in synchronization with a rising edge of the second internal strobe signal QDQS. The third data reception circuit 530 may receive the third one DQ<2> of the data DQ<0:n> and generate the third internal data IDQ<2> in synchronization with a rising edge of the third internal strobe signal IDQSB. The fourth data reception circuit 540 may receive the fourth one DQ<3> of the data DQ<0:n> and generate the fourth internal data IDQ<3> in synchronization with a rising edge of the fourth internal strobe signal QDQSB. After that, the first data reception circuit 510 may receive fifth one DQ<4> of the plurality of the data DQ<0:n>.

If the semiconductor apparatus 1 operates at the high frequency and/or the high speed, narrow pulse widths of the data strobe signal DQS and the complementary data strobe signal DQSB may reduce the timing margin when the data arrangement circuit 120 receives the data DQ<0:n>. Therefore, the internal strobe signal generating circuit 110 may generate all of the first to fourth internal strobe signals IDQS, QDQS, IDQSB, and QDQSB by dividing the data strobe signal DQS and the complementary data strobe signal DQSB. Also, all of the first to fourth data reception circuits 510, 520, 530, and 540 may be activated, and may sequentially receive the data DQ<0:n> consecutively provided according to the first to fourth internal strobe signals IDQS, QDQS, IDQSB, and QDQSB. In accordance with an embodiment of the present disclosure, even when the semiconductor apparatus 1 operates at the high frequency and/or the high speed, the semiconductor apparatus 1 may receive correct data through the greater number of the internal strobe signals having the divided period.

As illustrated in FIG. 8B, when the semiconductor apparatus 1 operates at low frequency and/or low speed, which are lower than the frequency and speed of the example illustrated in FIG. 8A, the data rate selection circuit 210 may disable the data rate selection signal DR. The division circuit 220 may be deactivated in response to the disabled data rate selection signal DR. The strobe output circuit 230 may provide the data strobe signal DQS as the first internal strobe signal IDQS and provide the complementary data strobe signal DQSB as the third internal strobe signal IDQSB while disabling the second and fourth internal strobe signals QDQS and QDQSB. Therefore, the second and fourth data reception circuits 520 and 540 may not be operable while the first and third data reception circuits 510 and 530 are operable in response to the first and third internal strobe signals IDQS and IDQSB.

The first data reception circuit 510 may receive the first one DQ<0> of the plurality of the data DQ<0:n> and generate the first internal data IDQ<0> in synchronization with the first rising edge of the first internal strobe signal IDQS. The third data reception circuit 530 may receive the second one DQ<1> of the data DQ<0:n> and generate the second internal data IDQ<1> in synchronization with the first rising edge of the third internal strobe signal IDQSB. The first data reception circuit 510 may receive the third one DQ<2> of the plurality of the data DQ<0:n> and generate the third internal data IDQ<2> in synchronization with the second rising edge of the first internal strobe signal IDQS. The third data reception circuit 530 may receive the fourth one DQ<3> of the data DQ<0:n> and generate the fourth internal data IDQ<3> in synchronization with the second rising edge of the third internal strobe signal IDQSB.

If the semiconductor apparatus 1 operates at the low frequency and/or the low speed, wide pulse widths of the data strobe signal DQS and the complementary data strobe signal DQSB may increase the timing margin for the data arrangement circuit 120 to receive the data DQ<0:n>. Therefore, the internal strobe signal generating circuit 110 may provide the data strobe signal DQS and the complementary data strobe signal DQSB, respectively, as the first and third internal strobe signals IDQS and IDQSB without dividing the data strobe signal DQS and the complementary data strobe signal DQSB. Accordingly, current consumption of the semiconductor apparatus 1 for the reception of data may be minimized by operating less number of the data reception circuits through less number of the internal strobe signals.

While certain embodiments have been described above, it will be understood to those skilled in the art that the embodiments described are by way of example only. Accordingly, the internal strobe signal generating circuit capable of selecting data rate and semiconductor apparatus including the same should not be limited based on the described embodiments. Rather, the internal strobe signal generating circuit capable of selecting data rate and semiconductor apparatus including the same described herein should only be limited in light of the claims that follow when taken in conjunction with the above description and accompanying drawings.

What is claimed is:

1. A semiconductor apparatus comprising:
   an internal strobe signal generating circuit configured to receive a data strobe signal and a complementary data strobe signal from an external device, and to generate a plurality of internal strobe signals, a number of which and a period of which vary according to operational information; and
   a data arrangement circuit configured to receive a plurality of data signals, and to align the plurality of data signals to the plurality of internal strobe signals,
   wherein the internal strobe signal generating circuit generates a first number of internal strobe signals having a first period when the semiconductor apparatus operates at high frequency, and generates a second number of internal strobe signals having a second period, which is shorter than the first period, when the semiconductor apparatus operates at low frequency, and the data strobe signal and the complementary data strobe signal have the second period,
   wherein the internal strobe signal generating circuit comprises a data rate selection circuit configured to enable a data rate selection signal according to the operational information; a division circuit configured to generate a plurality of divided strobe signals by dividing the data strobe signal and the complementary data strobe signal in response to the data rate selection signal; and a strobe output circuit configured to generate, in response to the data rate selection signal, the plurality of internal strobe signals based on the plurality of divided strobe signals or the plurality of internal strobe signals based on the data strobe signal and the complementary data strobe signal.

2. The semiconductor apparatus of claim 1, wherein the second period is shorter than the first period, and the second number is less than the first number.

3. The semiconductor apparatus of claim 1, wherein the plurality of internal strobe signals generated by the internal strobe signal generating circuit is:
   generated from one or more signals divided from the data strobe signal and the complementary data strobe signal when the semiconductor apparatus operates at high frequency; and
   generated from the data strobe signal and the complementary data strobe signal when the semiconductor apparatus operates at low frequency.

4. The semiconductor apparatus of claim 1, wherein the strobe output circuit provides the data strobe signal and the complementary data strobe signal as the plurality of internal strobe signals in response to the data rate selection signal disabled, and provides the plurality of divided strobe signals as the plurality of internal strobe signals in response to the data rate selection signal enabled.

5. The semiconductor apparatus of claim 4, wherein:
   the division circuit generates first to fourth divided strobe signals by dividing the data strobe signal and the complementary data strobe signal;
   the strobe output circuit provides the first to fourth divided strobe signals as first to fourth internal strobe signals in response to the data rate selection signal enabled; and
   the strobe output circuit provides the data strobe signal and the complementary data strobe signal as the first and third internal strobe signals while disabling the second and fourth internal strobe signals in response to the data rate selection signal disabled.

6. The semiconductor apparatus of claim 5, wherein the data arrangement circuit generates a plurality of internal data by latching the plurality of data signals based on the first to fourth internal strobe signals.

7. The semiconductor apparatus of claim 6, wherein the data arrangement circuit comprises:
   a first data reception circuit configured to receive the plurality of data signals based on the first internal strobe signal;
   a second data reception circuit configured to receive the plurality of data signals based on the second internal strobe signal;
   a third data reception circuit configured to receive the plurality of data signals based on the third internal strobe signal; and a fourth data reception circuit configured to receive the plurality of data signals based on the fourth internal strobe signal.

8. The semiconductor apparatus of claim 7, wherein:

the second and fourth data reception circuits are deactivated in response to the data rate selection signal disabled;

the first data reception circuit receives a firstly inputted data signal of the plurality of data signals in synchronization with a first rising edge of the first internal strobe signal, and receives a thirdly inputted data signal of the plurality of data signals in synchronization with a second rising edge of the first internal strobe signal; and the third data reception circuit receives a secondly inputted data signal of the plurality of data signals in synchronization with a first rising edge of the third internal strobe signal, and receives a fourthly inputted data signal of the plurality of data signals in synchronization with a second rising edge of the third internal strobe signal.

9. The semiconductor apparatus of claim 7, wherein, in response to the data rate selection signal enabled:

the first data reception circuit receives a firstly inputted data signal of the plurality of data signals in synchronization with a rising edge of the first internal strobe signal;

the second data reception circuit receives a secondly inputted data signal of the plurality of data signals in synchronization with a rising edge of the second internal strobe signal;

the third data reception circuit receives a thirdly inputted data signal of the plurality of data signals in synchronization with a rising edge of the third internal strobe signal; and the fourth data reception circuit receives a fourthly inputted data signal of the plurality of data signals in synchronization with a rising edge of the fourth internal strobe signal.

* * * * *